United States Patent
Dutta

(10) Patent No.: US 10,950,721 B2
(45) Date of Patent: Mar. 16, 2021

(54) SELF-ALIGNED HIGH VOLTAGE TRANSISTOR

(71) Applicant: QUALCOMM Incorporated, San Diego, CA (US)

(72) Inventor: Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/401,189

(22) Filed: May 2, 2019

(65) Prior Publication Data
US 2020/0350431 A1 Nov. 5, 2020

(51) Int. Cl.
*H01L 29/78* (2006.01)
*H01L 29/06* (2006.01)
*H01L 29/66* (2006.01)

(52) U.S. Cl.
CPC ...... *H01L 29/7816* (2013.01); *H01L 29/0649* (2013.01); *H01L 29/6653* (2013.01); *H01L 29/66681* (2013.01)

(58) Field of Classification Search
CPC .............. H01L 29/7816; H01L 29/0649; H01L 29/6653; H01L 29/66681
See application file for complete search history.

(56) References Cited

U.S. PATENT DOCUMENTS

| | | | | |
|---|---|---|---|---|
| 4,232,327 A | * | 11/1980 | Hsu | H01L 29/7835 257/353 |
| 4,299,449 A | * | 11/1981 | Ohta | G02F 1/332 359/286 |
| 5,306,656 A | * | 4/1994 | Williams | H01L 29/7835 438/283 |
| 5,534,721 A | * | 7/1996 | Shibib | H01L 29/0692 257/339 |
| 5,893,729 A | * | 4/1999 | Roisen | H01L 27/1203 257/E21.415 |
| 9,685,533 B1 | * | 6/2017 | Kuo | H01L 21/28088 |
| 9,871,132 B1 | * | 1/2018 | Liu | H01L 29/665 |

(Continued)

OTHER PUBLICATIONS

Cheung P., "Topic 3—CMOS Fabrication Process", Department of Electrical & Electronic Engineering, Imperial College London, Nov. 27, 2009, 5 Pages.

(Continued)

*Primary Examiner* — Peter Bradford
(74) *Attorney, Agent, or Firm* — Patterson & Sheridan, LLP

(57) ABSTRACT

Certain aspects of the present disclosure generally relate to a transistor having a self-aligned drift region and asymmetric spacers. One example transistor generally includes a channel region; a gate region disposed above the channel region; a first implant region; a second implant region having a same doping type as the first implant region, but a different doping type than the channel region; a first spacer disposed adjacent to a first side of the gate region; a second spacer disposed adjacent to a second side of the gate region and having a wider width than the first spacer; and a drift region having an edge vertically aligned with an edge of the second spacer and disposed between the channel region and the second implant region. The channel region may be disposed between the first implant region and the drift region.

19 Claims, 11 Drawing Sheets

(56) References Cited

U.S. PATENT DOCUMENTS

| | | | | |
|---|---|---|---|---|
| 10,249,629 | B1* | 4/2019 | Chen | H01L 21/31144 |
| 2008/0246086 | A1* | 10/2008 | Korec | H01L 29/4175 |
| | | | | 257/343 |
| 2010/0098767 | A1* | 4/2010 | Olbricht | A61M 5/1408 |
| | | | | 424/489 |
| 2011/0089492 | A1* | 4/2011 | Yilmaz | H01L 29/0653 |
| | | | | 257/343 |
| 2012/0098041 | A1* | 4/2012 | Verma | H01L 29/1095 |
| | | | | 257/288 |
| 2014/0217501 | A1* | 8/2014 | Sulistyanto | H01L 29/66681 |
| | | | | 257/343 |
| 2016/0099340 | A1* | 4/2016 | Hsu | H01L 29/7825 |
| | | | | 257/339 |
| 2016/0149007 | A1* | 5/2016 | Chou | H01L 29/402 |
| | | | | 257/339 |
| 2017/0125589 | A1* | 5/2017 | Xu | H01L 29/66628 |
| 2017/0179280 | A1* | 6/2017 | Yadav | H01L 29/0865 |
| 2017/0352731 | A1* | 12/2017 | Kuo | H01L 29/402 |
| 2017/0373063 | A1* | 12/2017 | Bao | H01L 21/823814 |
| 2019/0051747 | A1* | 2/2019 | Cortes Mayol | H01L 29/66696 |
| 2019/0058039 | A1* | 2/2019 | Cai | H01L 29/0878 |
| 2019/0088777 | A1* | 3/2019 | Lu | H01L 29/66659 |
| 2019/0229193 | A1* | 7/2019 | Toh | H01L 29/513 |
| 2019/0273151 | A1* | 9/2019 | Zhao | H01L 21/2658 |
| 2019/0288112 | A1* | 9/2019 | Wang | H01L 29/0878 |
| 2020/0350431 | A1* | 11/2020 | Dutta | H01L 29/0649 |

OTHER PUBLICATIONS

Kim Y.J., et al., "Stripping and Cleaning of High-Dose Ion-Implanted Photoresists Using a Single-Wafer, Single-Chamber Dry/Wet Hybrid System", Solid State Phenomena, vol. 145-146, 2009, pp. 269-272.

* cited by examiner

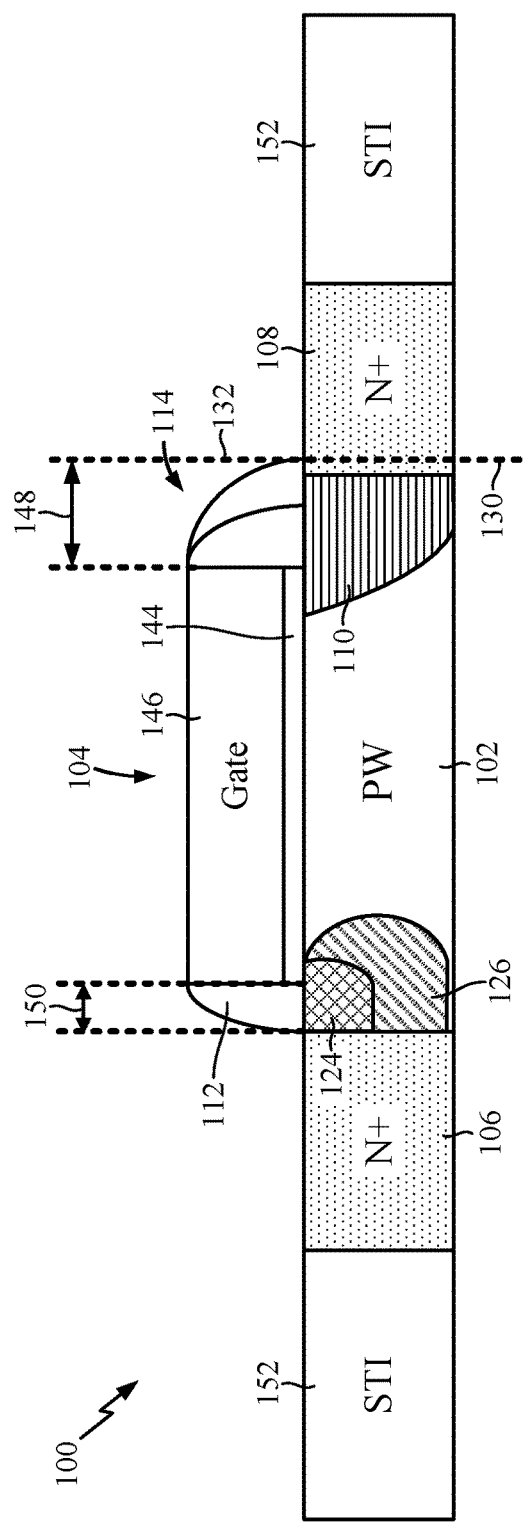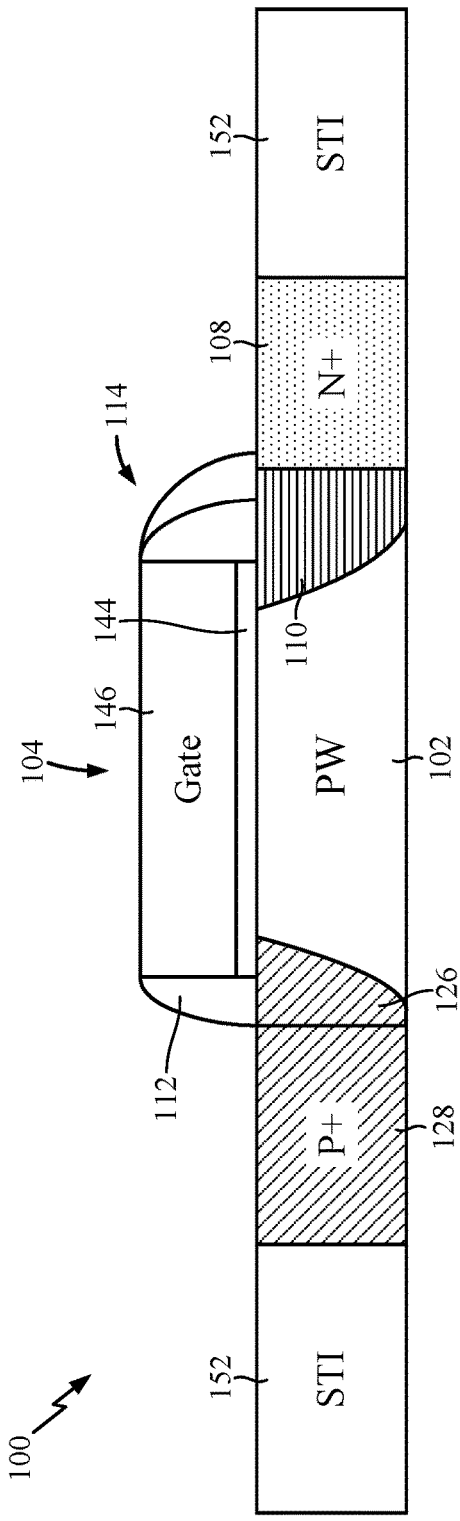
FIG. 2A
FIG. 2B

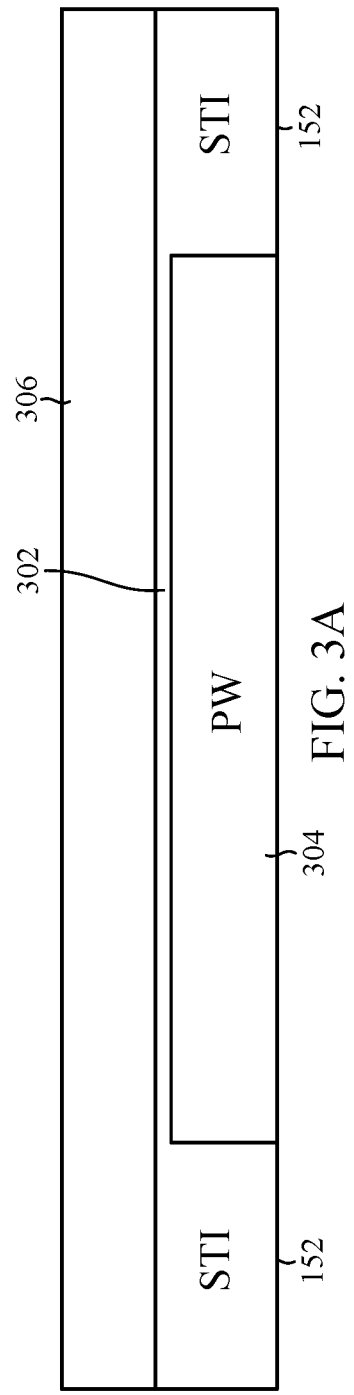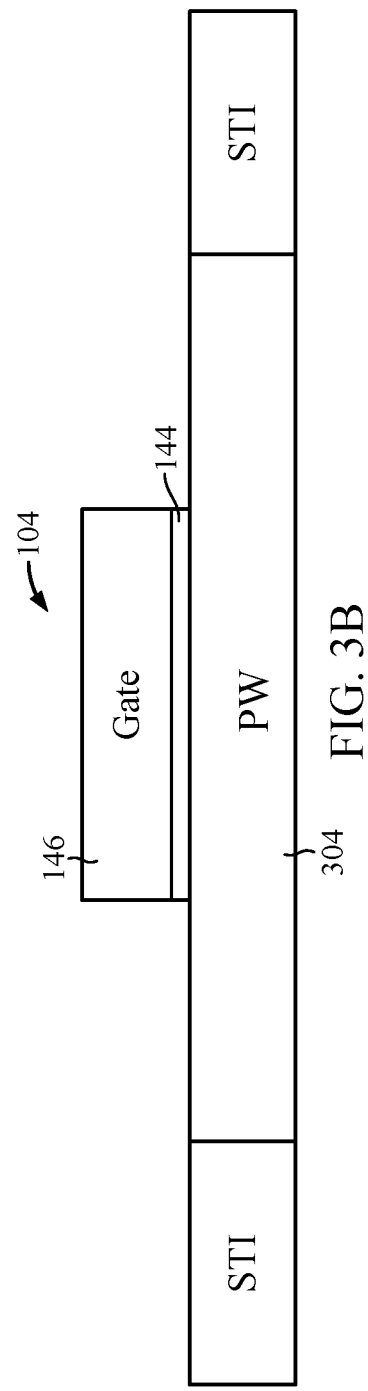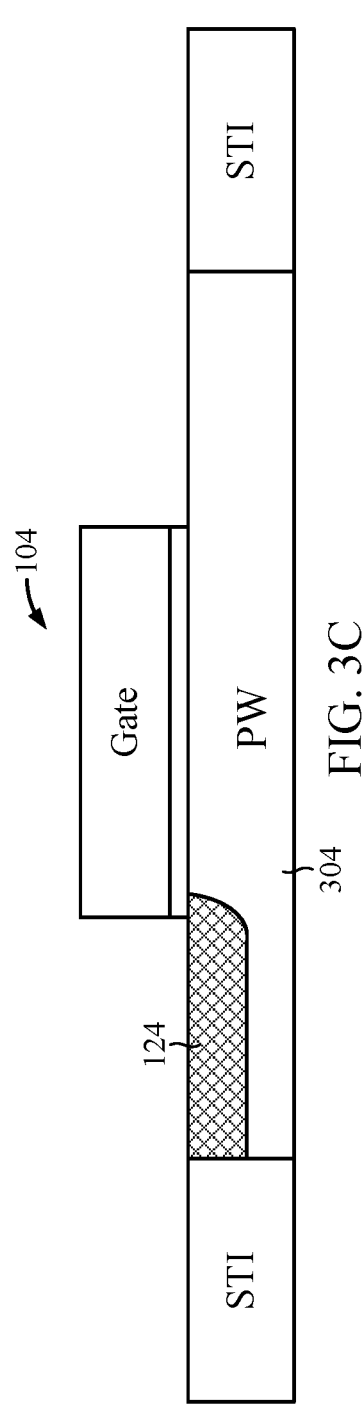

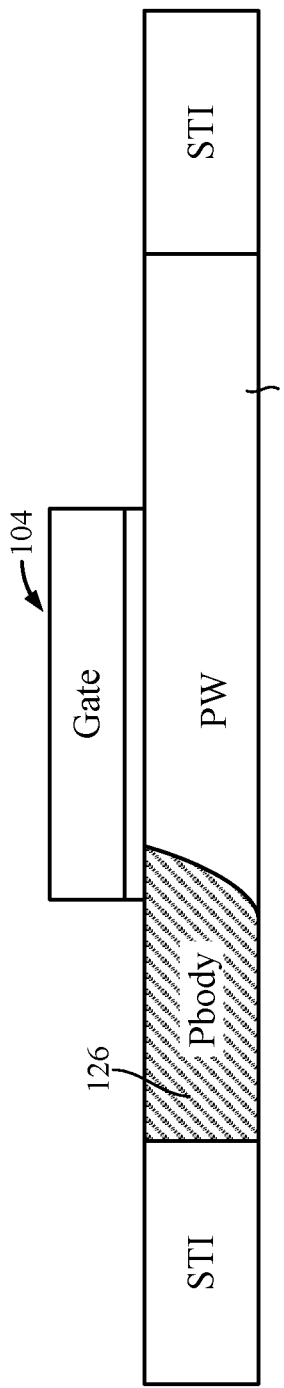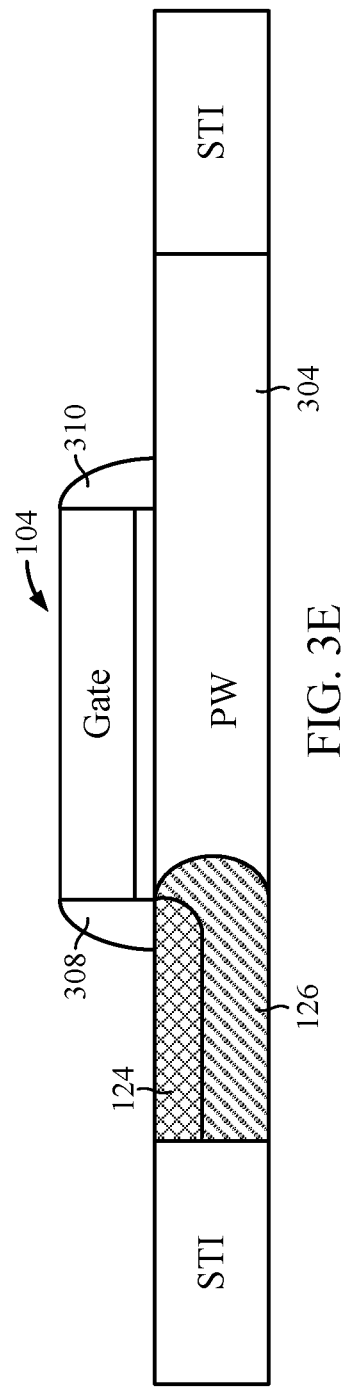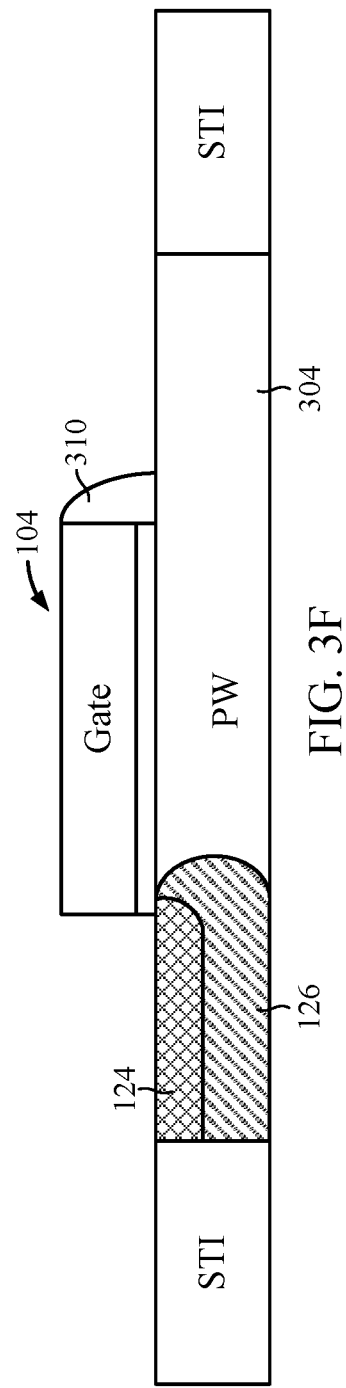

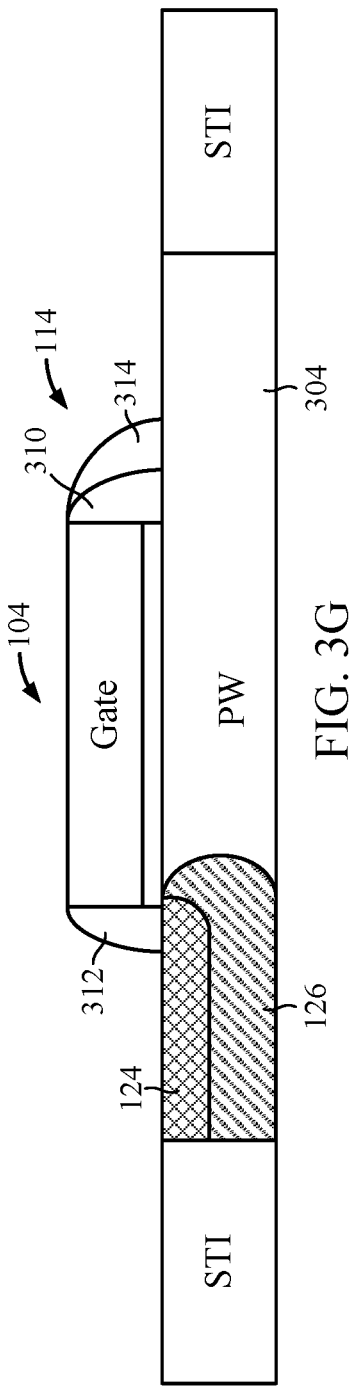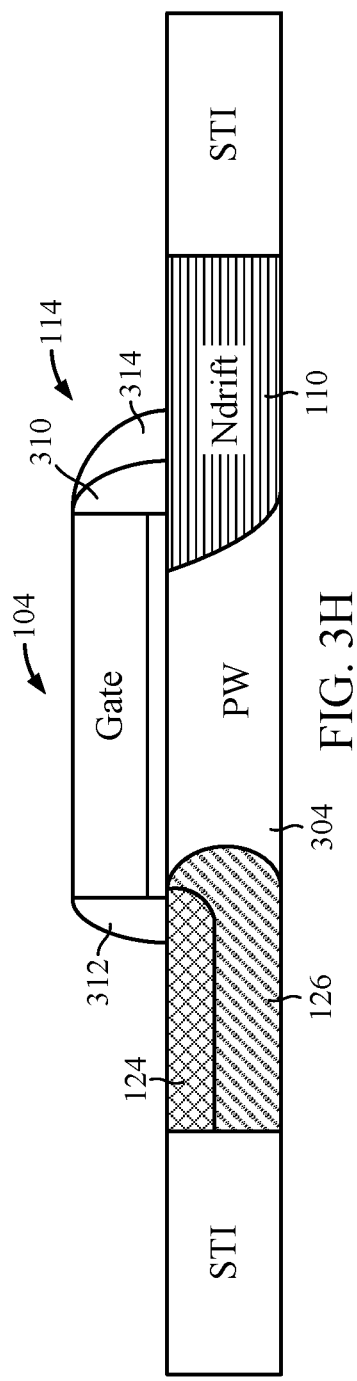

SELF-ALIGNED HIGH VOLTAGE TRANSISTOR

BACKGROUND

Field of the Disclosure

Certain aspects of the present disclosure generally relate to electronic components and, more particularly, to a transistor having a self-aligned drift region and asymmetric spacers.

Description of Related Art

A transistor is a semiconductor device used to perform various operations. For example, a transistor may be used as a solid-state switch or used to amplify signals. There are several types of transistors, one of the most common types being a metal-oxide-semiconductor field-effect transistor (MOSFET). A MOSFET may be implemented as a p-type transistor, referred to as a p-type metal-oxide-semiconductor (PMOS) transistor, or an n-type transistor, referred to as an n-type metal-oxide-semiconductor (NMOS) transistor, both of which have a similar structure, but are implemented with semiconductor regions having opposite doping types.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved high voltage, high speed transistors.

Certain aspects of the present disclosure provide a transistor. The transistor generally includes a channel region; a gate region disposed above the channel region; a first implant region; a second implant region having a same doping type as the first implant region, but a different doping type than the channel region; a first spacer disposed adjacent to a first side of the gate region; a second spacer disposed adjacent to a second side of the gate region and having a wider width than the first spacer; and a drift region having an edge vertically aligned with an edge of the second spacer and disposed between the channel region and the second implant region. The channel region may be disposed between the first implant region and the drift region.

Certain aspects of the present disclosure provide a method for fabricating a transistor. The method generally includes forming a gate region above a channel region; forming a first implant region; forming a second implant region having a same doping type as the first implant region, but a different doping type than the channel region; forming a first spacer adjacent to a first side of the gate region; forming a second spacer adjacent to a second side of the gate region and having a wider width than the first spacer; and forming a drift region having an edge vertically aligned with an edge of the second spacer and disposed between the channel region and the second implant region.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 2A illustrates a cross-sectional view of the example transistor of FIG. 1, in accordance with certain aspects of the present disclosure.

FIG. 2B illustrates another cross-sectional view of the example transistor of FIG. 1, in accordance with certain aspects of the present disclosure.

FIG. 3A illustrates a cross-sectional view of an example semiconductor having a gate oxide disposed thereon, in accordance with certain aspects of the present disclosure.

FIG. 3B illustrates a cross-sectional view of a gate region formed on the semiconductor, in accordance with certain aspects of the present disclosure.

FIG. 3C illustrates a cross-sectional view of a lightly doped region formed in the semiconductor, in accordance with certain aspects of the present disclosure.

FIG. 3D illustrates a cross-sectional view of an implant region formed in the semiconductor, in accordance with certain aspects of the present disclosure.

FIG. 3E illustrates a cross-sectional view of a first spacer formed adjacent to the gate region, in accordance with certain aspects of the present disclosure.

FIG. 3F illustrates a cross-sectional view of the first spacer removed on one of the sides of the gate region, in accordance with certain aspects of the present disclosure.

FIG. 3G illustrates a cross-sectional view of a second spacer formed adjacent to the gate region, in accordance with certain aspects of the present disclosure.

FIG. 3H illustrates a cross-sectional view of a drift region formed in the semiconductor, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
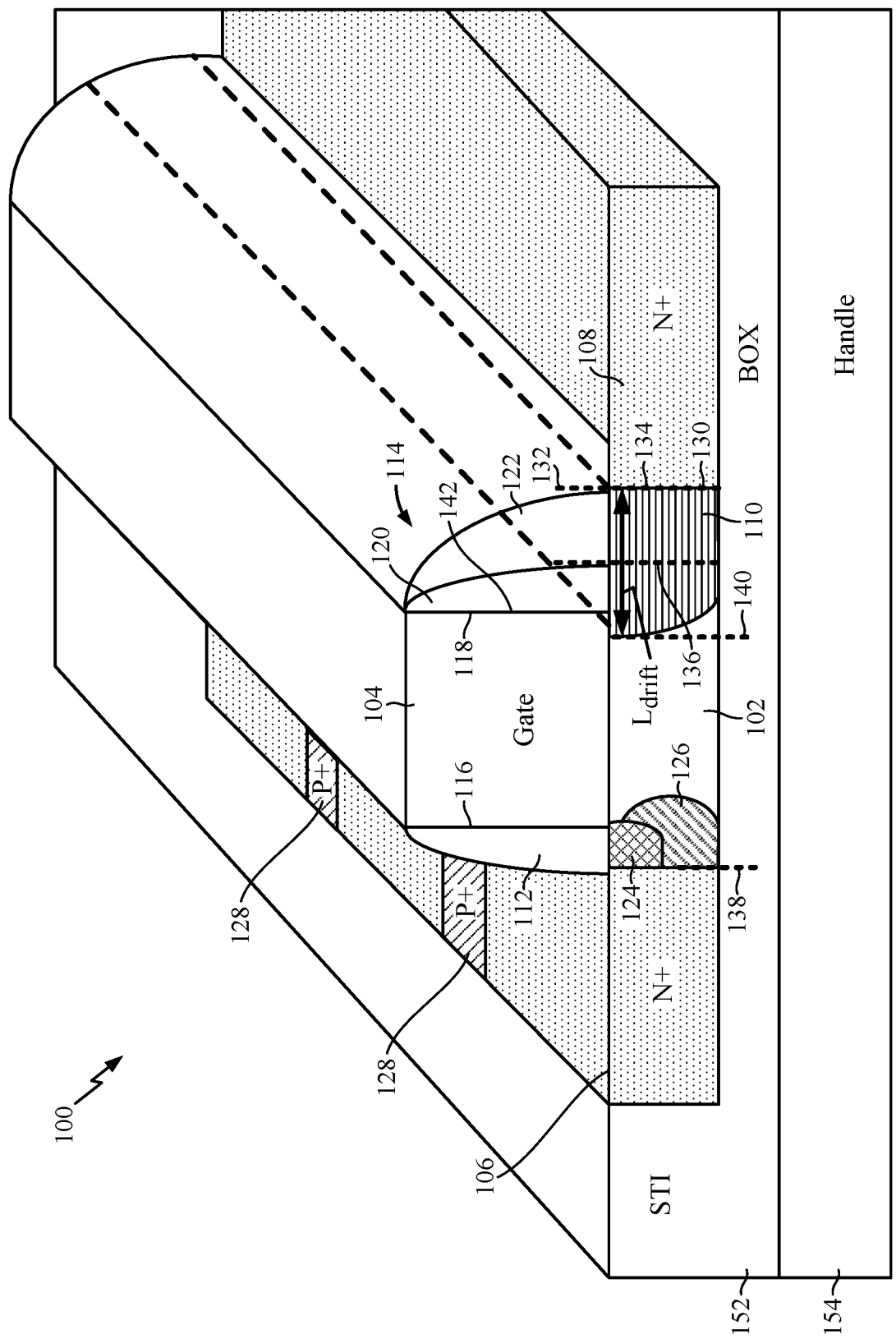
FIG. 1 illustrates an example transistor having a self-aligned drift region and asymmetric spacers, in accordance with certain aspects of the present disclosure.

Certain aspects of the present disclosure relate to a high-voltage, high-speed transistor, suitable for use in radio frequency (RF) power amplifiers (PAs) operating at sub-6 GHz (e.g., 450-6000 MHz) bands and/or mmWave bands (e.g., 24-30 GHz), power management integrated circuits (PMICs), and other circuits. As an example, the transistor may include a self-aligned drift region and asymmetric spacers adjacent to a gate region. For example, the drain-side spacer may be wider than the source-side spacer. The drain-side spacer may enable the drift region to have a resistance suitable for high power applications due to the length of the drift region. The drain-side spacer may also prevent a layer of silicide from forming over the drift region when contacts for the drain, source, and/or gate are formed on the transistor.

Example Transistor

In high-voltage applications (such as a radio frequency (RF) power amplifier used in an RF front-end circuit), transistors benefit from having enhanced transition frequency ($f_T$), reduced on-resistance ($R_{on}$), and a high breakdown voltage ($V_{bd}$). Also, in power amplification applications for certain wireless communication networks (such as 5G New Radio wireless networks), the transistors may benefit from having an enhanced maximum frequency ($f_{max}$) above the sub-6 GHz frequency bands or mmWave bands (e.g., 24-30 GHz)). Integration of high voltage transistors on a standard complementary metal-oxide-semiconductor (CMOS) process flow may be constrained by a high $R_{on}$ and low $f_T$ and $f_{max}$ due to high density of the high resistivity drain and device variability due to misalignment tolerance of the drain and drift region with respect to the gate. As a result, a short gate length ($L_g$) and a $V_{bd}$ in lower ranges (e.g., under 10 V) may not be feasible using conventional high voltage devices.

Certain aspects of the present disclosure are generally directed to a high speed, high voltage transistor. For example, the present disclosure relates to a self-aligned high voltage, high speed power transistor useful for RF power amplifiers (PAs) operating at sub-6 GHz and/or mmWave bands, power management integrated circuits (PMICs), and any of various other suitable circuits. As used herein, high voltage applications may include operating electronic components (such as the example transistor described herein) at voltages significantly higher than digital power supplies, for example, for maximizing power delivered by an RF PA to the antenna (output power may be proportional to the square of the voltage). A high speed device generally refers to a device that has sufficiently high $f_T$, $f_{max}$ (e.g., typically 3 to 10 times the operating frequency) to ensure good performance (e.g., output power, gain, efficiency) at the operating frequency such as the sub-6 GHz or mmWave bands.

The transistors described herein may be fully compatible with both silicon-on-insulator (SOI) and bulk planar CMOS process flows, and scalable to a minimum channel length for 5G RF front-end circuits. For example, the example transistor may be integrated into any of the planar CMOS process flows under consideration for 5G mmWave PAs. As another example, the transistor described herein may enable integration of the PMIC (e.g., envelope trackers) on the 5G RF front-end circuit.

The self-aligned transistor architecture described herein may reduce variabilities from lithography alignment tolerance and in drift and channel lengths, enabling corresponding design rules for the RF front-end circuit to shrink. As further described herein, the example transistor may have asymmetric spacers adjacent to a gate region. The asymmetric spacers may enable the example transistor to require no silicide stop layer to prevent silicide formation on the drift region ($N_{drift}$), which may simplify and reduce the cost of the fabrication process. A self-aligned drift region of the example transistor may enable custom design tradeoffs between $V_{bd}$, $f_T$, and $R_{on}$ by reducing variabilities in the layout and ion implant conditions, as well as a drain spacer thickness. The example transistor may provide a superior $V_{bd}$ relative to $R_{on}$, $f_T$, $f_{max}$, and gate-drain capacitance ($C_{gd}$), due to gate length scalability and the self-aligned aspect of the drift region further described herein, such as providing consistent drift and channel lengths.

FIG. 1 illustrates an example transistor 100 having a self-aligned drift region, in accordance with certain aspects of the present disclosure. As shown, the transistor 100 includes a channel region 102 (e.g., a p-well region), a gate region 104, a first implant region 106 (e.g., an n+ doped semiconductor region), a second implant region 108 (e.g., an n+ doped semiconductor region), a drift region 110 (e.g., a self-aligned, n doped semiconductor region), a first spacer 112, and a second spacer 114.

In certain aspects, the first implant region 106 may be configured as a source of the transistor 100, and the second implant region 108 may be configured as the drain of the transistor 100. The first implant region 106 may be disposed adjacent to a first side 138 of the channel region 102, and the drift region 110 may be disposed adjacent to a second side 140 of the channel region 102.

The first spacer 112 may be disposed adjacent to a first side 116 of the gate region 104, and the second spacer 114 may be disposed adjacent to a second side 118 of the gate region 104. The first side 116 of the gate region 104 may be opposite from the second side 118, as illustrated in FIG. 1. The second spacer 114 may include a third spacer 120 disposed adjacent to the second side 118 of the gate region 104 and a fourth spacer 122 disposed adjacent to the third spacer 120, as further described herein with respect to FIG. 3G.

In certain aspects, a lightly doped region 124 (e.g., a lightly doped implant) may be disposed between the first implant region 106 and the channel region 102. The lightly doped region 124 may have the same doping type as the first implant region 106, but with a lower dopant concentration than the first implant region 106. In certain aspects, a third implant region 126 (e.g., a p-type semiconductor body (p-body)) may be disposed adjacent to the lightly doped region 124 and have a different doping type than the lightly doped region 124. The third implant region 126 may mitigate kink effects and may be used either with or without a p-well implanted in the channel region 102, but is beneficial when a p-well is not implanted in the channel region 102.

In certain aspects, one or more fourth implant regions 128 (e.g., a p+ doped semiconductor) may be interposed in the first implant region 106. The fourth implant regions 128 may have a different doping type than the first implant region 106, but with a higher dopant concentration than the third implant region 126. The fourth implant regions 128 may be self-aligned to the gate region 104.

The drift region 110 may be self-aligned to the second spacer 114 (third spacer 120 or fourth spacer 122) and/or second implant region 108. The length ($L_{drift}$) of the drift region 110 may be configured to enable operation of the transistor at high voltage. $L_{drift}$ may be adjusted based on the width of the second spacer 114 as further described herein with respect to FIG. 3H. As an example of the self-alignment of the drift region 110, the drift region 110 may have an edge 130 vertically aligned with an edge 132 of the second spacer 114. The second implant region 108 may also have an edge 134 vertically aligned with the edge 132 of the second spacer 114. The drift region 110 may be disposed between the channel region 102 and the second implant region 108 and have the same doping type as the second implant region 108. Another edge 142 of the second spacer 114 may be disposed adjacent to the second side 118 of the gate region 104.

The alignment of the drift region 110 with respect to the second spacer 114 may enable the second spacer 114 to prevent a silicide from being formed over the drift region 110 when contacts for the drain, source, and gate are formed on the transistor 100. As such, the transistor 100 may not have a separate layer of silicide block (e.g., salicide stop) disposed above the drift region 110 outside of the second spacer 114.

As shown, the drift region 110 is self-aligned to the fourth spacer 122. In certain aspects, the drift region 110 may be self-aligned to the third spacer 120. In other words, the edge 130 of the drift region 110 may be vertically aligned with an edge 136 of the third spacer 120 after implant. After annealing, the portion of the drift region between the edges 130 and 136 may be covered by the drift dopant, by diffusion.

As shown, the first implant region 106 and second implant region 108 may be disposed between shallow trench isolation (STI) regions 152 to electrically isolate the transistor 100 from other components that may be disposed adjacent to the transistor 100.

A silicon handle 154 may be disposed under a buried oxide layer (such as the STI region 152), which in turn is under the channel region, as a supporting structure during the fabrication process. The silicon handle 154 may be thinned after completing the fabrication of the integrated circuit (e.g., an RF front-end circuit) comprising the transistor 100. In certain aspects, the transistor 100 may be fabricated on a silicon-on-insulator (SOI) substrate or a bulk silicon substrate.

In certain aspects, the transistor 100 may be configured as an n-type metal-oxide-semiconductor (NMOS) transistor. For example, the first implant region 106 and second implant region 108 may be n+ doped semiconductors. While the examples provided herein are described with respect to an NMOS transistor to facilitate understanding, aspects of the present disclosure may also be applied to a p-type MOS (PMOS) transistor. For example, for a PMOS transistor, the first implant region 106 and second implant region 108 may be p+ doped semiconductors, whereas the channel region 102 may be an n-well region.

FIG. 2A illustrates a cross-sectional view of the example transistor 100, in accordance with certain aspects of the present disclosure. As shown, the gate region 104 may include a gate dielectric layer 144 (e.g., as a silicon oxide) and a non-insulative region 146 (e.g., a polysilicon and/or a conductive metal) disposed above the gate dielectric layer 144. As used herein, a "non-insulative region" generally refers to a region that may be electrically conductive or semiconductive.

In certain aspects, the second spacer 114 may have a wider width 148 than the width 150 of the first spacer 112. That is, the transistor 100 may have asymmetric spacers 112, 114, where the drain-side spacer (e.g., the second spacer 114) is wider than the source-side spacer (e.g., the first spacer 112). The width of the second spacer 114 may be used to adjust the length of the drift region 110, which may affect the breakdown voltage of the transistor 100. In certain aspects, the edge 132 of the second spacer 114 may overhang the drift region 110 due to side diffusion of the highly doped second implant region 108, but regardless of the side diffusion, the drift region may still be considered to align vertically with the second spacer 114. For example, portions of the second spacer 114 may be disposed above the drift region 110 and second implant region 108. The overhang or vertical alignment of the second spacer 114 as shown in FIGS. 1 and 2A, respectively, enables the second spacer 114 to prevent a salicide contact from forming on the drift region 110.

FIG. 2B illustrates another cross-section view of the example transistor 100, where the cross-section passes through one of the fourth implant regions 128, in accordance with certain aspects of the present disclosure. As shown, the fourth implant region 128 may be disposed between the STI regions 152 and channel region 102.

FIGS. 3A-3I illustrate example operations for fabricating a transistor with a self-aligned drift region and asymmetric spacers adjacent to the gate region, in accordance with certain aspects of the present disclosure. The operations may be performed by a semiconductor fabrication facility, for example.

As shown in FIG. 3A, a gate oxide 302 may be disposed on or at least above a semiconductor 304 (e.g., a p-well semiconductor). In certain aspects, the semiconductor 304 may be implanted with a dopant to provide a semiconductor such as a p-well. In other aspects, the semiconductor 304 may not be implanted with a p-well. For example, the semiconductor 304 may be a p-type semiconductor having the same doping concentration as the starting substrate material such as the top layer of the SOI or silicon substrate. In further aspects, a portion of the semiconductor 304 may be implanted with p-well on the source side, and another portion of the semiconductor 304 may not be implanted with p-well as further described herein with respect to FIGS. 7A and 7B. The STI regions 152 may also be formed to isolate the transistor from other electrical components, as previously described. A polysilicon layer 306 may be disposed above the gate oxide 302.

Referring to FIG. 3B, portions of the polysilicon layer 306 and gate oxide 302 may be removed (e.g., using a pattern mask and etching process) to form the gate region 104 as described herein with respect to FIGS. 1 and 2A.

Figure 3I:
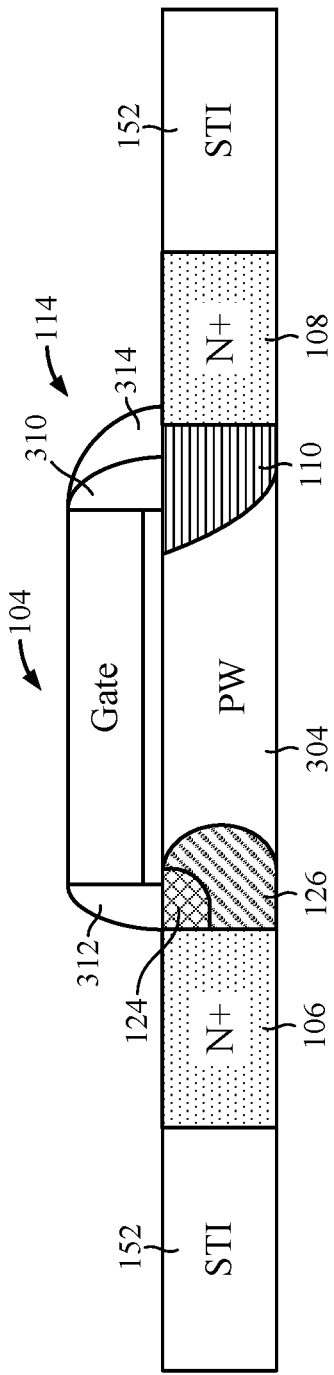
FIG. 3I illustrates a cross-sectional view of source and drain implant regions formed in the semiconductor, in accordance with certain aspects of the present disclosure.

As illustrated in FIG. 3C, the lightly doped region 124 may be formed in the semiconductor 304. For example, a mask may be used to implant lightly doped arsenic (As) and/or phosphorous (P) on the source side with respect to the gate region 104. As shown, the implant for the lightly doped region 124 may extend across the semiconductor 304 into a region that will later be doped as the first implant region 106 as described herein with respect to FIG. 3I. In certain aspects, the lightly doped region 124 may not be implanted in the fourth implant region 128.

As depicted in FIG. 3D along a different cross-sectional view (e.g., corresponding to the cross-section shown in FIG. 2B illustrating the fourth implant region 128) with respect to FIG. 3C, a third implant region 126 may be formed in the semiconductor 304. For example, a mask may be used to implant boron (B) in the semiconductor 304 to form a p-type semiconductor body (p-body) on the source side with respect to the gate region 104. The third implant region 126 may be self-aligned to the gate region 104 on the source side.

Referring to FIG. 3E and starting from the cross-sectional view depicted in FIG. 3C (e.g., corresponding to the cross-section shown in FIG. 2A illustrating the first implant region 106), a first spacer 308 and a second spacer 310 may be disposed adjacent to the gate region 104 and above the semiconductor 304. For example, a dielectric spacer may be deposited adjacent to the gate region 104. The second spacer 310 on the drain side may correspond to the third spacer 120 illustrated in FIG. 1. In certain aspects, the drift region may be formed in the semiconductor 304 on the drain side to enable the drift region to be self-aligned with the second spacer 310.

As shown in FIG. 3F, the first spacer 308 on the source side may be removed. For example, removal of the first spacer 308 may be accomplished by using a mask that keeps the second spacer 310 on the drain side intact and an etching process that removes the first spacer on the source side.

As illustrated in FIG. 3G, a third spacer 312 and a fourth spacer 314 may be disposed adjacent to the gate region 104 and above the semiconductor 304. For example, a dielectric spacer may be deposited adjacent to the gate region 104 on the source side and adjacent to the second spacer 310 on the drain side. The third spacer 312 on the source side may correspond to the first spacer 112 illustrated in FIG. 1. The fourth spacer 314 on the drain side may correspond to the fourth spacer 122 depicted in FIG. 1. The second spacer 310 and fourth spacer 314 on the drain side may correspond to the second spacer 114 shown in FIG. 1. The second spacer 310 and the fourth spacer 314 may have a combined width that is wider than the width of the third spacer 312 as described herein with respect to FIG. 2A.

Referring to FIG. 3H, a drift region (e.g., $N_{drift}$ region) 316 may be formed in the semiconductor 304 on the drain side. For example, a mask may be used to implant phosphorous (P) in the semiconductor 304 under the second spacer 310 and fourth spacer 314 using a tilted deposition with at least four rotations. The length of the drift region 110 may be configured to enable operation at high voltages due to the resistance provided by the drift region 110. The length of the drift region 110 may depend on the width of the second spacer 114 (e.g., the width of the second spacer 310 and fourth spacer 314) during the implantation of the drift region 110. The drift region 110 may extend across the semiconductor 304 into a region that will later be doped as the second implant region 108 as described herein with respect to FIG. 3I.

Referring to FIG. 3I, the first implant region 106 (e.g., n+ doped semiconductor) may be formed adjacent to the lightly doped region 124 in the semiconductor 304. The second implant region 108 (e.g., n+ doped semiconductor region) may be formed adjacent to the drift region 110 in the semiconductor 304. For example, a mask may be used to implant the semiconductor with a highly doped concentration on the source and drain sides to form the first and second implant regions 106, 108. The second spacer 114 may be disposed above the drift region 110 to prevent a salicide contact from being formed on the drift region 110.

Figure 3J:
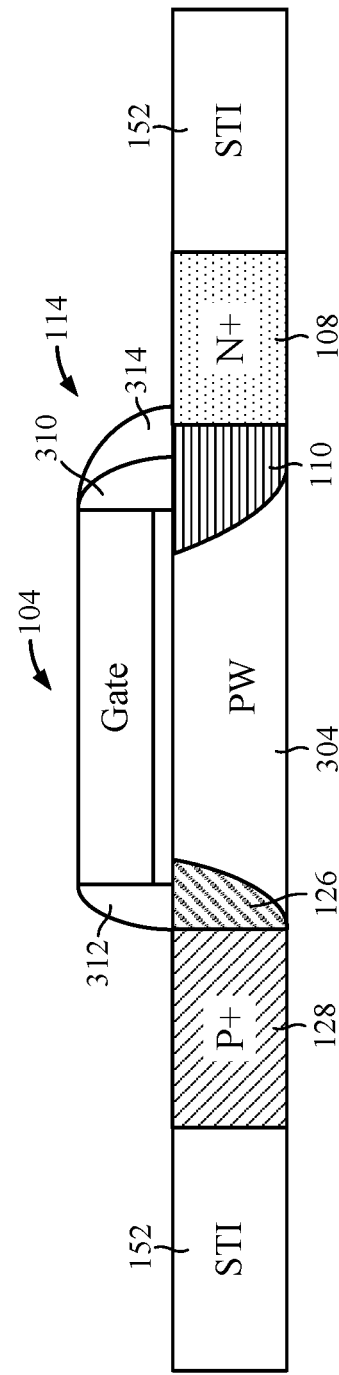
FIG. 3J illustrates a cross-sectional view of an implant region interposed on the source side of the transistor, in accordance with certain aspects of the present disclosure.

As shown in FIG. 3J, the fourth implant region 128 (e.g., p+ doped semiconductor) may be formed adjacent to the third implant region 126 and the STI region 152. For example, a mask may be used to implant the fourth implant regions 128 in the semiconductor 304 as p+ stripes interposed in the first implant region 106 as depicted in FIG. 1. The implantation of the fourth implant region 128 may be performed before or after the implantation of the first implant region 106.

Figure 4:
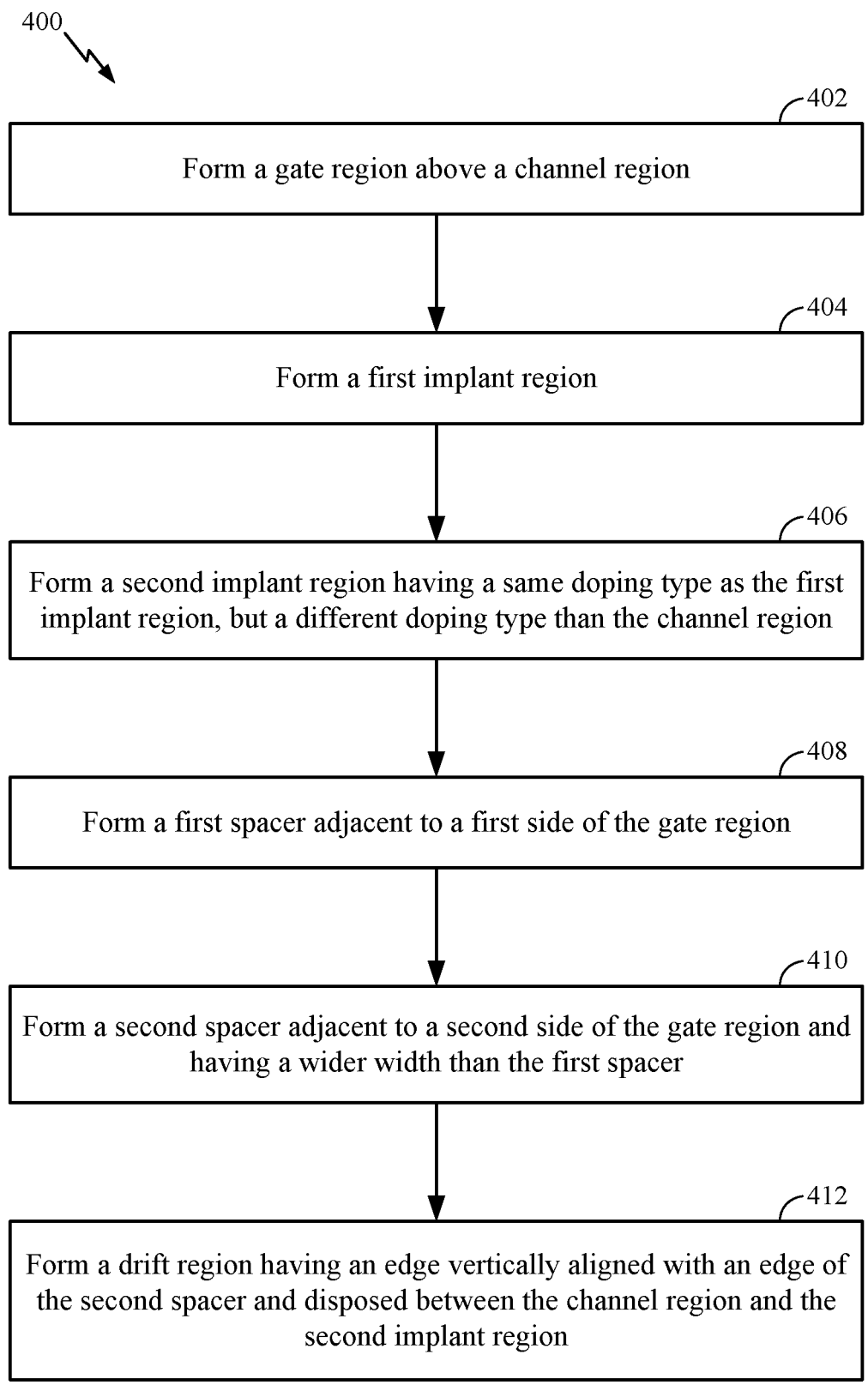
FIG. 4 is a flow diagram of example operations for fabricating a transistor, in accordance with certain aspects of the present disclosure.

FIG. 4 is a flow diagram of example operations 400 for fabricating a transistor (e.g., the transistor 100 of FIG. 1), in accordance with certain aspects of the present disclosure. The operations 400 may be performed by a semiconductor fabrication facility, for example.

The operations 400 begin, at block 402, by forming a gate region (e.g., gate region 104) above a channel region (e.g., channel region 102) of a semiconductor (e.g., semiconductor 304). At block 404, a first implant region (e.g., first implant region 106) may be formed adjacent to the channel region, for example, in the semiconductor 304. At block 406, a second implant region (e.g., second implant region 108) may be formed having a same doping type as the first implant region, but a different doping type than the channel region. At block 408, a first spacer (e.g., first spacer 112) may be formed adjacent to a first side of the gate region. At block 410, a second spacer (e.g., second spacer 114) may be formed adjacent to a second side of the gate region and having a wider width than the first spacer. At block 412, a drift region (e.g., drift region 110) may be formed having an edge vertically aligned with an edge of the second spacer and between the channel region and the second implant region.

In certain aspects, operations 400 may also include forming one or more third implant regions (e.g., fourth implant regions 128) interposed in the first implant region. The one or more third implant regions may have a different doping type than the first implant region.

In certain aspects, operations 400 may include forming one or more fourth implant regions (as further described herein with respect to FIG. 5) interposed in the drift region and between the channel region and the second implant region. The fourth implant regions may have a different doping type than the drift region or be dielectric regions (e.g., STI regions).

Figure 5:
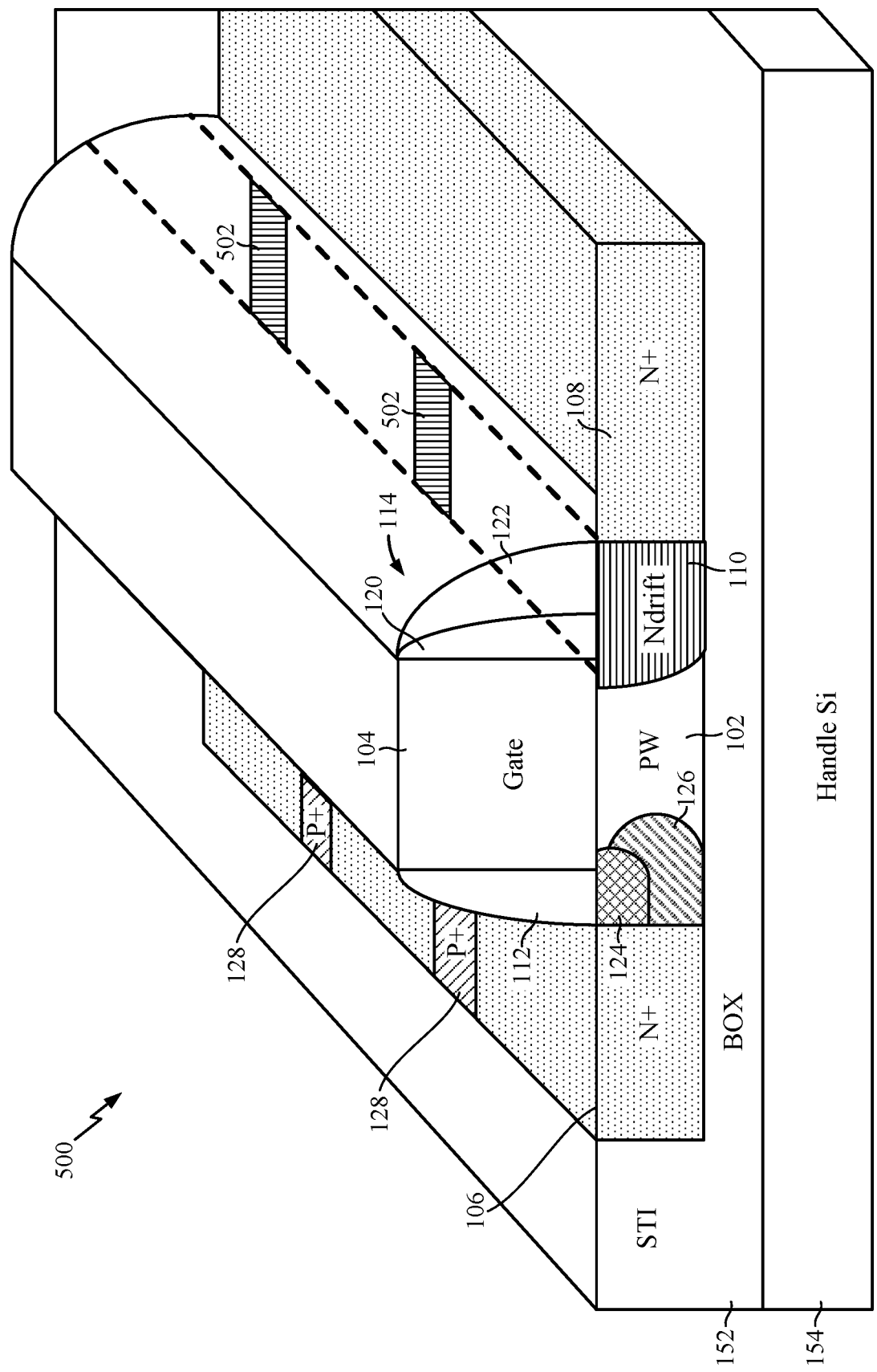
FIG. 5 illustrates an example transistor having additional implant regions on the drain side, in accordance with certain aspects of the present disclosure.

FIG. 5 illustrates an example transistor 500 having additional implant regions on the drain side, in accordance with certain aspects of the present disclosure. As shown, one or more fourth implant regions 502 may be interposed in the drift region 110 and disposed between the channel region 102 and the second implant region 108. The fourth implant regions 502 may provide a reduced surface field (RESURF) for an enhanced breakdown voltage suitable for use in high-voltage applications. In certain aspects, the fourth implant regions 502 (e.g., a p-doped semiconductor) may have a different doping type than the drift region. In other aspects, the one or more fourth implant regions 502 may be dielectric regions, such as STI regions.

Figure 6:
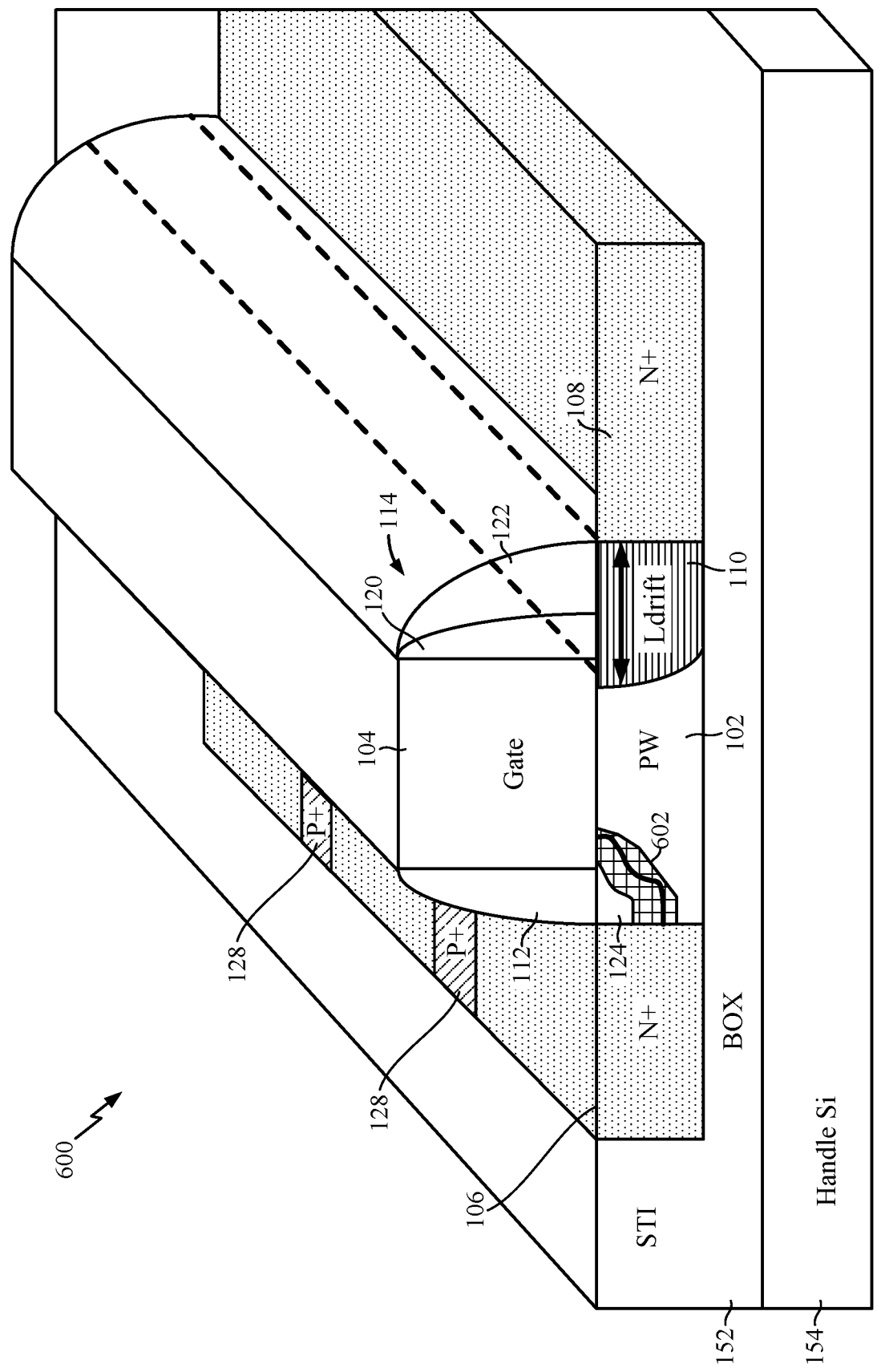
FIG. 6 illustrates another example transistor having a halo region adjacent to a lightly doped region on the source side, in accordance with certain aspects of the present disclosure.

FIG. 6 illustrates another example transistor 600 having a halo region adjacent to the lightly doped region 124 on the source side, in accordance with certain aspects of the present disclosure. As shown, a halo region 602 may be disposed adjacent to the lightly doped region 124. The halo region 602 may have the same doping type (e.g., p-type doping) as the lightly doped region 124.

Figure 7A:
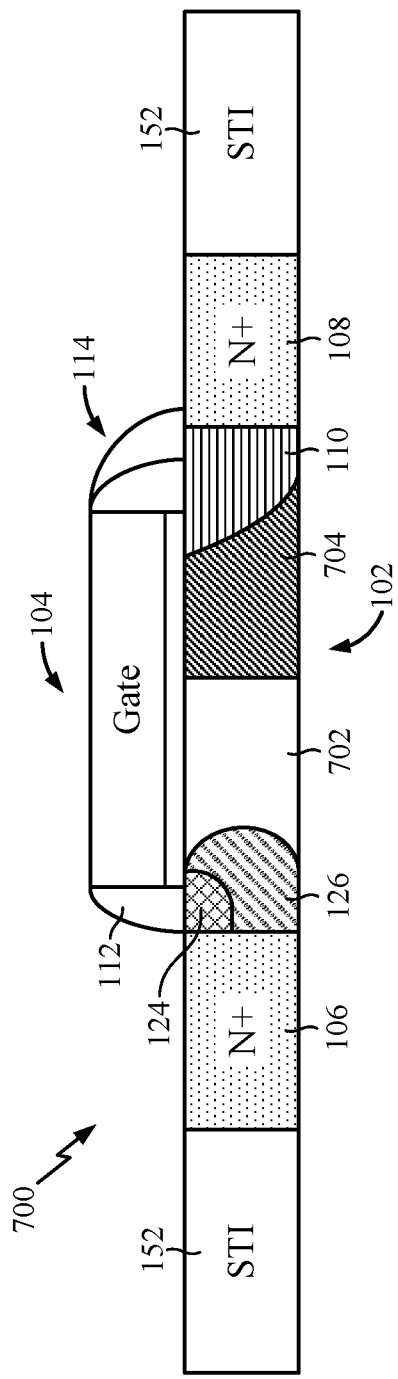
FIG. 7A illustrates a cross-sectional view of an example transistor having a split doping region, in accordance with certain aspects of the present disclosure.
Figure 7B:
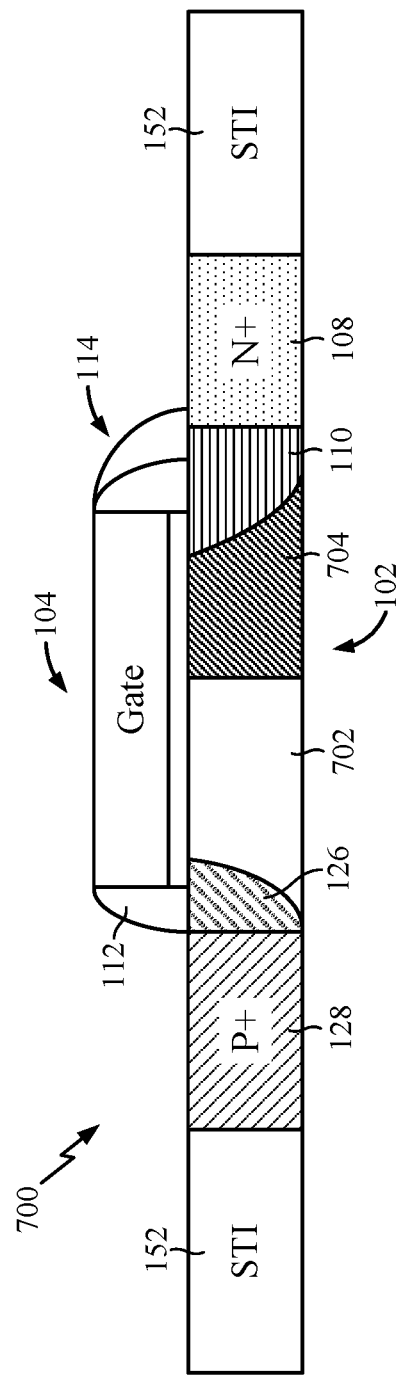
FIG. 7B illustrates another cross-sectional view of the example transistor of FIG. 7A, in accordance with certain aspects of the present disclosure.

FIGS. 7A and 7B illustrate an example transistor 700 with a split doping in the channel region, in accordance with certain aspects of the present disclosure. As shown in FIGS.

7A and 7B (corresponding to the cross-sections shown in FIGS. 2A and 2B, respectively), the channel region 102 may include an implanted channel region 702 (e.g., a p-well) on the source side and an unimplanted channel region 704 on the drain side. For example, a mask may be used to prevent implantation of a dopant in the unimplanted channel region 704 as the p-type dopant is implanted in the semiconductor of the channel region on the source side.

Example RF Front-End Circuit

Figure 8:
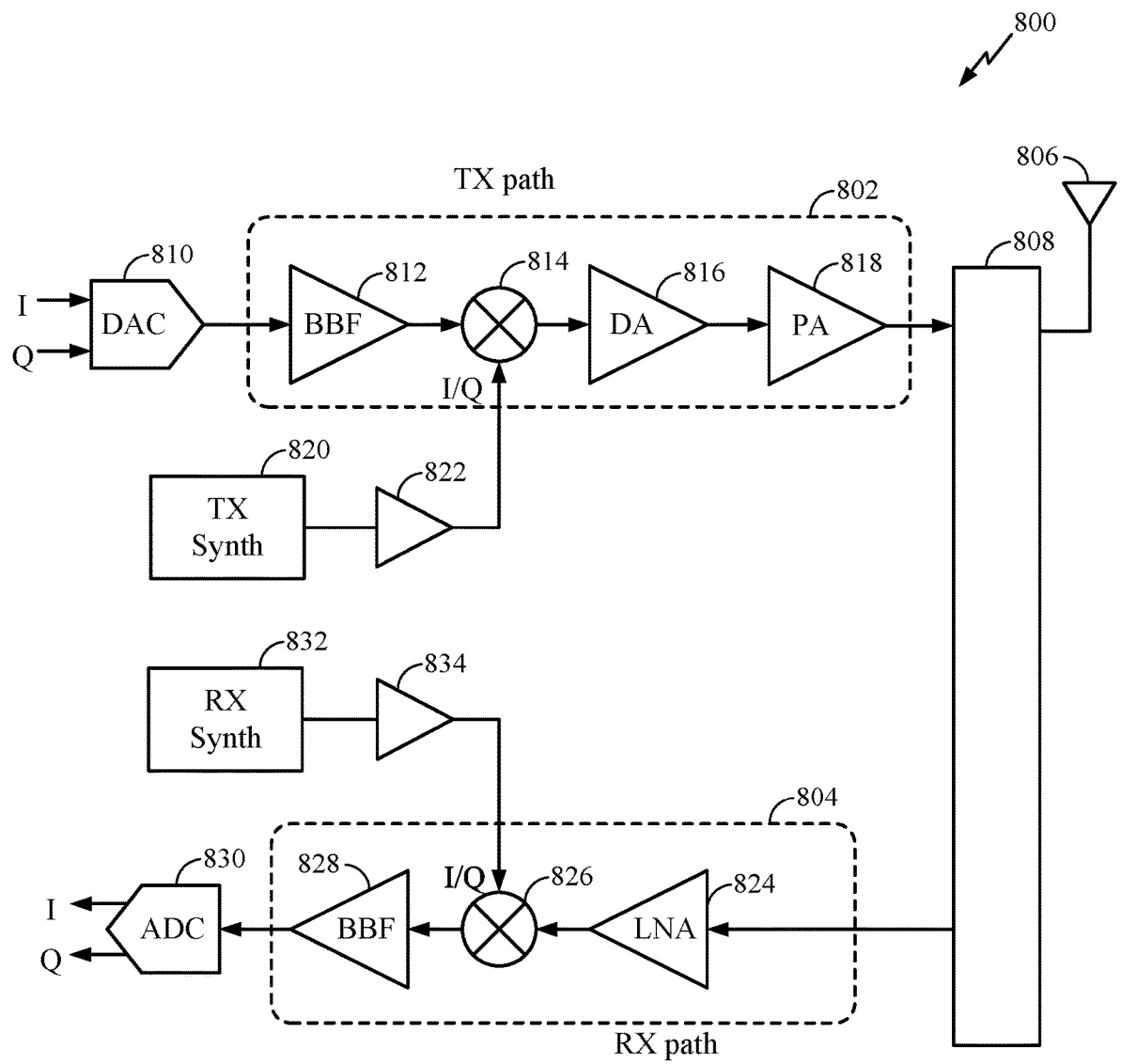
FIG. 8 is a block diagram showing an example transceiver front-end circuit, in accordance with certain aspects of the present disclosure.

FIG. 8 is a block diagram of an example RF front-end circuit 800, in accordance with certain aspects of the present disclosure. The RF front-end circuit 800 includes at least one transmit (TX) path 802 (also known as a transmit chain) for transmitting signals via one or more antennas and at least one receive (RX) path 804 (also known as a receive chain) for receiving signals via the antennas. When the TX path 802 and the RX path 804 share an antenna 806, the paths may be connected with the antenna via an interface 808, which may include any of various suitable RF devices, such as a duplexer, a switch, a diplexer, and the like.

Receiving in-phase (I) or quadrature (Q) baseband analog signals from a digital-to-analog converter (DAC) 810, the TX path 802 may include a baseband filter (BBF) 812, a mixer 814, a driver amplifier (DA) 816, and a power amplifier (PA) 818. The BBF 812, the mixer 814, and the DA 816 may be included in a radio frequency integrated circuit (RFIC), while the PA 818 may be included in the RFIC or external to the RFIC. The PA 818 may include the example transistors (e.g., transistor 100, 500, 600, or 700) described herein for high-voltage, high-speed applications, especially for RF front-end circuits configured to operate at the sub-6 GHz and/or mmWave bands.

The BBF 812 filters the baseband signals received from the DAC 810, and the mixer 814 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 814 are typically RF signals, which may be amplified by the DA 816 and/or by the PA 818 before transmission by the antenna 806.

The RX path 804 may include a low noise amplifier (LNA) 824, a mixer 826, and a baseband filter (BBF) 828. The LNA 824, the mixer 826, and the BBF 828 may be included in a RFIC, which may or may not be the same RFIC that includes the TX path components. RF signals received via the antenna 806 may be amplified by the LNA 824, and the mixer 826 mixes the amplified RF signals with a receive local oscillator (LO) signal to convert the RF signal of interest to a different baseband frequency (e.g., downconvert). The baseband signals output by the mixer 826 may be filtered by the BBF 828 before being converted by an analog-to-digital converter (ADC) 830 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 820, which may be buffered or amplified by amplifier 822 before being mixed with the baseband signals in the mixer 814. Similarly, the receive LO may be produced by an RX frequency synthesizer 832, which may be buffered or amplified by amplifier 834 before being mixed with the RF signals in the mixer 826.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A transistor comprising:
a channel region;
a gate region disposed above the channel region;
a first implant region;
a second implant region having a same doping type as the first implant region, but a different doping type than the channel region;
a first spacer disposed adjacent to a first side of the gate region;
a second spacer disposed adjacent to a second side of the gate region and having a wider width than the first spacer, wherein the second spacer comprises two or more dielectric spacers; and
a drift region having an edge vertically aligned with an edge of the second spacer and disposed between the channel region and the second implant region, wherein the channel region is disposed between the first implant region and the drift region.

2. The transistor of claim 1, further comprising:
one or more third implant regions disposed between portions of the first implant region, the one or more third implant regions having a different doping type than the first implant region; and
a fourth implant region disposed between the second implant region and the channel region.

3. The transistor of claim 1, wherein the second implant region has an edge vertically aligned with the edge of the second spacer.

4. The transistor of claim 1, further comprising a lightly doped region between the first implant region and the channel region, wherein the lightly doped region has a same doping type as the first implant region.

5. The transistor of claim 1, wherein the second spacer comprises a third spacer disposed adjacent to the second side of the gate region and a fourth spacer disposed adjacent to the third spacer.

6. The transistor of claim 1, further comprising one or more third implant regions disposed between portions of the drift region, disposed between the channel region and the second implant region, and having a different doping type than the drift region.

7. A transistor comprising:
a channel region;
a gate region disposed above the channel region;
a first implant region;
a second implant region having a same doping type as the first implant region, but a different doping type than the channel region;
a first spacer disposed adjacent to a first side of the gate region;
a second spacer disposed adjacent to a second side of the gate region and having a wider width than the first spacer, wherein the second spacer comprises two or more dielectric spacers;
a drift region having an edge vertically aligned with an edge of the second spacer and disposed between the channel region and the second implant region, wherein the channel region is disposed between the first implant region and the drift region; and
one or more dielectric regions disposed between portions of the drift region.

8. The transistor of claim 7, wherein the one or more dielectric regions comprise one or more shallow trench isolation (STI) regions.

9. The transistor of claim 1, further comprising a gate dielectric layer disposed above the channel region.

10. The transistor of claim 1, wherein the transistor is configured as a p-type metal-oxide-semiconductor (PMOS) transistor.

11. The transistor of claim 1, wherein the transistor is configured as an n-type metal-oxide-semiconductor (NMOS) transistor.

12. The transistor of claim 1, wherein the first implant region is configured as a source of the transistor and wherein the second implant region is configured as a drain of the transistor.

13. The transistor of claim 1, wherein the first implant region is disposed adjacent to a first side of the channel region and wherein the drift region is disposed adjacent to a second side of the channel region.

14. The transistor of claim 1, wherein another edge of the second spacer is disposed adjacent to the second side of the gate region.

15. A method for fabricating a transistor, comprising:
forming a gate region above a channel region;
forming a first implant region;
forming a second implant region having a same doping type as the first implant region, but a different doping type than the channel region;
forming a first spacer adjacent to a first side of the gate region;
forming a second spacer adjacent to a second side of the gate region and having a wider width than the first spacer, wherein the second spacer comprises two or more dielectric spacers;
forming a drift region having an edge vertically aligned with an edge of the second spacer and disposed between the channel region and the second implant region; and
forming one or more third implant regions disposed between portions of the drift region and between the channel region and the second implant region.

16. The method of claim 15, wherein forming the one or more third implant regions comprises forming the one or more third implant regions between portions of the first implant region, the one or more third implant regions having a different doping type than the first implant region.

17. The method of claim 15, wherein the second implant region has an edge vertically aligned with the edge of the second spacer.

18. The method of claim 15, further comprising forming a lightly doped region between the first implant region and the channel region, wherein the lightly doped region has a same doping type as the first implant region.

19. The method of claim 15, wherein forming the second spacer comprises:
   forming a third spacer adjacent to the second side of the gate region; and
   forming a fourth spacer adjacent to the third spacer.

* * * * *